US006707363B1

(12) United States Patent
Abele

(10) Patent No.: US 6,707,363 B1
(45) Date of Patent: Mar. 16, 2004

(54) NMR HEAD IMAGING SYSTEM

(75) Inventor: Manlio Abele, New York, NY (US)

(73) Assignee: BRK Wireless Company, Inc., Park Ridge, IL (US)

( * ) Notice: Subject to any disclaimer, the term of this patent is extended or adjusted under 35 U.S.C. 154(b) by 0 days.

(21) Appl. No.: 10/393,999

(22) Filed: Mar. 24, 2003

Related U.S. Application Data

(63) Continuation-in-part of application No. 10/336,333, filed on Jan. 6, 2003.

(51) Int. Cl.[7] ............................................. H01F 7/02
(52) U.S. Cl. ..................................... 335/306; 324/319
(58) Field of Search ......................... 335/216, 296–306; 324/318–320; 600/410–423

(56) References Cited

U.S. PATENT DOCUMENTS

| 3,205,415 A | * | 9/1965 | Seki et al. | 335/210 |
| 3,768,054 A | * | 10/1973 | Neugebauer | 335/304 |
| 4,647,887 A | * | 3/1987 | Leupold | 335/211 |
| 4,658,228 A | * | 4/1987 | Leupold | 335/211 |

* cited by examiner

Primary Examiner—Ramon M. Barrera

(57) ABSTRACT

An open magnetic structure comprising a conical magnetic structure that generates an NMR imaging field around the head of a patient, and a transition magnetic structure including a cylindrical magnet connected to the conical magnetic structures that extends the uniform field generated in the head magnet cavity to the shoulders of the patient. The overall geometry is designed to integrate the magnetic structure in a surgical suite with a minimum interference with surgical procedures, which typically involve surgery on the brain of the patient.

22 Claims, 8 Drawing Sheets

US 6,707,363 B1

NMR HEAD IMAGING SYSTEM

RELATED APPLICATION

This application is a continuation-in-part by the same inventor of a commonly-owned application Ser. No. 10/336,333, filed Jan. 6, 2003.

The invention is directed to an NMR head imaging system using permanent magnets to establish the uniform imaging field.

BACKGROUND OF INVENTION

The related application, whose full contents are herein incorporated by reference, describes a magnetic structure designed for NMR head imaging in interventional procedures. The requirements to be satisfied are described in detail in the related application. These requirements are satisfied by a permanent magnetic structure capable of generating a uniform field for NMR imaging over a region of interest encompassing the head of a patient and that is open at one side allowing access to the head of the patient by a physician for surgical or other medical purposes. In a preferred embodiment described in that application, the magnetic structure of the invention comprises a head structure generating a uniform magnetic field in a region of interest encompassing the patient's head, coaxially aligned with a shoulder structure generating a magnetic field that extends the uniform field to a second larger region encompassing the patient's shoulder, and joined to the head structure by a coaxially aligned transition structure which maintains the uniform magnetic field in the region connecting the first and second regions. A feature of that invention is a magnetic structure comprising a single pole piece that extends throughout the structure, which pole piece is connected to the head, shoulder, and transition magnetic structures, with the single pole piece in the shoulder region being configured to house a second magnet that cooperates in extending the uniform field to the shoulder region.

SUMMARY OF INVENTION

An object of the present invention is an improved NMR head imaging system that can be open from three sides thereby improving access by the operating surgeon, while at the same time provides a maximum strength of the NMR imaging field.

These objects are achieved in accordance with one aspect of the invention by a structure of the magnet characterized by a conical section connected to a larger cylindrical section, wherein the region of interest in which the uniform field is centered along the cone axis.

The region inside the larger cylindrical magnet is configured to accommodate the patient's shoulders.

In a preferred embodiment, the region inside the conical magnet is constituted of a high-permability ferromagnetic material defined below.

In a further preferred embodiment, the magnetic structure comprises opposed, spaced circular-symmetric structures with the region of interest falling within a cavity between the circular-symmetric structures. In still another preferred embodiment, a second larger cylindrical magnet extends over the each of the circular-symmetric structures.

The three main permanent magnetic components of the structure of the preferred embodiment are all magnetized in the same direction, preferably parallel to the axis of the conical segment.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

SUMMARY OF THE DRAWINGS

In the drawings:

FIG. 8 is an exploded view of a magnetic structure similar to that of FIG. 7.

DETAILED DESCRIPTION OF PREFERRED EMBODIMENTS

Figure 1:
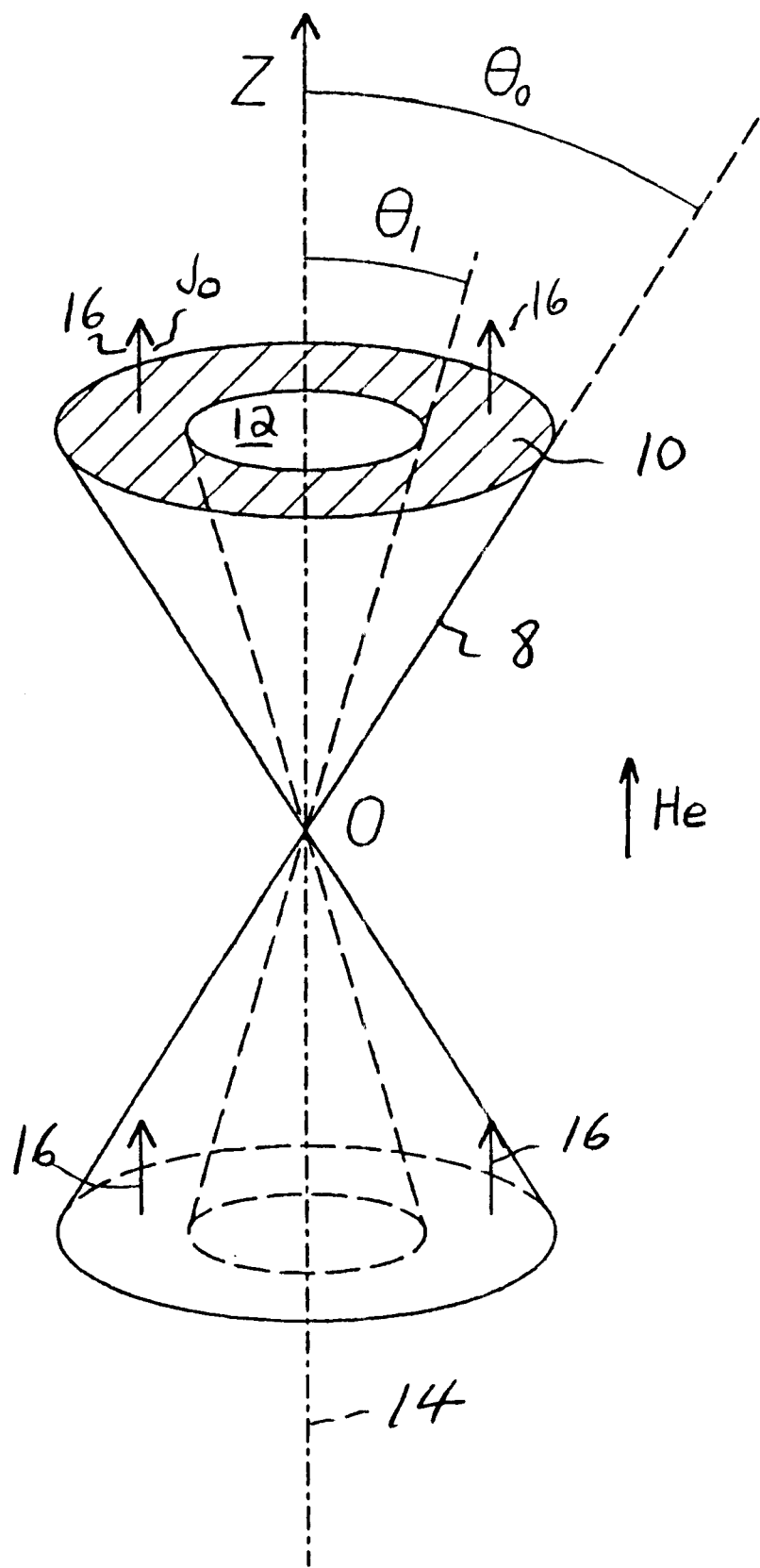
FIG. 1 is a schematic perspective view of a conical magnetic structure to explain several of the principles on which the invention is based.

For a better understanding of the present invention, the reader is urged to read the many technical papers which I alone or with others published and which describe various configurations of NMR imaging systems as well as various schemes for compensating for magnetic field disturbances in composite structures that have been characterized as yoked, yokeless, or hybrid magnets. Particular attention is directed to issued U.S. Pat. Nos. 5,495,222; 5,790,006, and 6,265,959 which describe some of the problems of fabricating open magnetic structures with NMR imaging uniform fields and some solutions to those problems, the contents of which patents and publications are herein incorporated by reference.

It will also help to present some definitions of terms used herein to avoid ambiguity. These definitions include the following.

A "high permeability" member, as used herein, shall mean a soft ferromagnetic body having a permeability, $\mu$, exceeding 10 and preferably as high as possible. For simplicity, it is sometimes referred to in the literature as a ($\mu=\infty$) material, i.e., an ideal soft ferromagnetic body. For virtually all practical purposes, the performance of infinite permeability, unsaturated ferromagnetic material is the equivalent of soft iron.

A "yoked magnetic system", as used herein, is a permanent magnetic structure surrounded by a body of high permeability material serving as a yoke to carry the return flux of the induction B from one pole of the magnetic structure to the other pole. To avoid saturation, the yoke should have a large enough cross sectional area to convey the flux without saturating. The cross section typically varies to satisfy local flux-carrying requirements.

A "hybrid magnetic system", as used herein, which is the type of magnetic system employed herein, is a permanent magnetic structure only partially surrounded by a body of high permeability material, both the high permeability material where present and the non-surrounded parts of the structure serving to carry the return flux of the induction B from one pole of the magnetic structure to the other pole. To avoid saturation, the body of high permeability material which can also be called a yoke should have a large enough cross sectional area to convey the flux without saturating. The yoke cross section typically varies to satisfy local flux-carrying requirements.

A "uniform magnetic field", as used herein, shall mean a magnetic field that over a region of interest has an intensity that varies by less than 10 ppm.

The term "substantially" appears from time to time in the specification and claims. It should be understood in a practical sense to mean small variations in some structure or parameter term that do not make significant changes in properties associated with those structures or parameters and are included within the scope of the associated term.

Magnetic systems of this kind are often designed using a so-called non-dimensional number identified by the symbol K, which can vary between 0 and 1. As an example only of a particular magnetic structure in accordance with the invention, K is chosen to have a value equal to about 0.426. It will also be understood that permanent magnetic materials having the highest magnetic properties including remanence are preferred. Nowadays, these are the rare earth magnets such as Nd,B,Fe.

When the application speaks of "configuring" the magnetic structure, this is to be understood in the context of this and the referenced literature to mean the design scheme of selecting the geometry, dimensions, materials, and magnetizations of the various members of the structure in the light of the design parameter K chosen and such additional constraints as the desired active field intensity, maintenance of field uniformity, and reduction of stray fields.

Open magnetic structures used to implement NMR imaging are often constructed of blocks of permanent magnetic material assembled to form the configuration of the sides, top, and bottom of the structure desired and defining a cavity on its interior for receiving the patient. This is typically a simpler scheme for fabricating such systems as regularly shaped blocks uniformly magnetized in a single direction are easier to fabricate by the usual powder metallurgy and grinding steps. Thus, where the specification or claims call for, for example, a conical or cylindrical-shaped magnetic structure, this should be understood to include a single member with that configuration, or several members held together by magnetic forces forming a composite member with that configuration, since, magnetically speaking, the performance is substantially the same. Moreover, though the magnetic shapes used to illustrate the invention are typically shown with smooth surfaces, in many cases the structure configuration could be implemented with several joined magnetic members which together produce a functional equivalent. For example, the round surface of a conical or cylindrical configuration can sometimes be more easily obtained with a composite structure made up of thin round slabs of permanent magnetic material which form a slightly stepped outer surface. The composite structure, overall, would still be classified as conical or cylindrical, as the case may be, and the resultant orientation of their magnetic fields can still be represented by a single arrow. For convenience, it may also be simpler to define the system using an arbitrary rectangular or spherical coordinate system, in which, as shown in the literature referenced, linear dimensions of the rectangular system coordinate system are measured along the x, y or z dimension, and the corresponding dimensions of the spherical coordinate system are measured along radii and by angles from arbitrary lines or planes. Also, for convenience of explanation, in the preferred embodiment which is analyzed in the spherical coordinate system, the direction of the uniform field is chosen parallel to the z axis which happens to be the cone axis also, and the patient's orientation is chosen such that his or her longitudinal axis is perpendicular to the z axis, so that, when the patient is within the magnetic structure for head imaging in a normal position flat on his or her back, his or her body stretches in a direction perpendicular to the z direction, and thus perpendicular to the direction of the uniform field in the plane of the body. The patient would normally lie on a non-magnetic table within the system, but for convenience the table is not shown in the drawings as it has no effect on the magnetic properties. The spherical coordinate system is indicated in the drawings. The description of the invention focuses on the magnetic structure in the vicinity of the head and shoulders of the patient. It will also be understood that, in practical situations, normal manufacturing tolerances both in dimensions as well as in magnetic properties of the magnetic blocks introduce minor field distortions and fluctuations which are commonly compensated by a known process called "tuning", using shims to adjust the positions of the magnetic members, and filters for field non-uniformities. Also, in the drawings, arrows are present labeled with a J or H where J is the standard symbol for remanence, H the standard symbol for the magnitude of the uniform field, and $\mu$ the standard symbol for magnetic permeability.

The concepts underlying the development of the invention involve the following recognitions.

1. A uniform magnetic field capable of implementing NMR imaging can be generated in a cavity by a conical structure defining an inner conical section and a coaxial outer conical section positioned adjacent the cavity, with selected cone angles.
2. The conical shape provides a small cavity connected to an adjacent larger cavity, in which the small cavity can be configured to accommodate the head of a patient, and the adjacent larger cavity can be configured to accommodate the shoulders of the patient.
3. The outer conical section comprises permanent magnetic material and the inner conical section comprises high permeability magnetic material.
4. The latter by itself is not sufficient to provide a uniform field capable of implementing NMR imaging. It is also necessary to extend laterally the outer cone magnet by an additional first permanent magnet, with both permanent magnet members having their remanences oriented in the same direction which is the axis of symmetry of the overall structure and also the orientation of the uniform field in the cavity.

5. The strength of the uniform field can be augmented by positioning an additional second permanent magnet on the outside of the conical structure, i.e., adjacent the wide end of the conical structure, with its remanence oriented in the same direction as that of the first additional permanent magnet.

6. The magnetic structure should have a configuration allowing imaging of the patient's head while the patient is lying flat on his or her back.

7. The patient's head should be accessible both vertically as well as horizontally to the physician.

8. To insure the required field uniformity within the region of the patient's brain, the uniform magnetic field must be extended from the head cavity to the region of the patient's shoulders.

In implementing the principles described above, a number of different configurations of magnetized material and soft ferromagnetic materials may be used. Preferred configurations will be described in detail below, but it will be understood that the invention is not limited to those particular configurations and dimensions where indicated and other different combinations of magnetic materials and of other dimensions can be employed following the principles described below to achieve the benefits of the invention, as will be understood by those skilled in this art.

The reader's attention is directed to the attached Appendix which is a more rigorous mathematical explanation of the principles on which the invention is based. The following description will focus on the structural arrangements. For more details of how to implement embodiments of the invention, the reader is urged to also review the Appendix whose full contents are herein incorporated by reference as supplemented by the referenced paper and patents.

The invention can be better understood in the context of the simple conical structure illustrated in FIG. 1 comprising two coaxial cones 10, 12 having a common cone axis 14 also designated as the z axis. The conical structure at the top has an apex at the center labeled 0 which is also the apex of the symmetrical inverted conical structure at the bottom. The outer cone 10 is shown cross hatched for clarity and is contained between half-angle $\theta_0$ and half-angle $\theta_1$. The outer cone 10 is shown magnetized uniformly with the remanence 16 oriented vertically as shown parallel to the z axis. The inner cone 12 is shown without hatching for clarity and is assumed to be ferromagnetic with a high permeability. Outside of the cone's outer conical surfaces 8 is a nonmagnetic medium. As explained in the Appendix, there will be formed adjacent the cone 10 a uniform magnetic field that is also oriented parallel to the z-axis. The equipotential lines for the region adjacent the right side 8 of the upper cone magnet 10 is indicated at 18 in FIG. 2, and the equipotential lines inside the magnet 10 is indicated at 20. For the example given in the Appendix, to which the invention is not limited, the conical structure of FIG. 1 generates a uniform field of intensity approximately equal to 0.55 Tesla.

Figure 3:
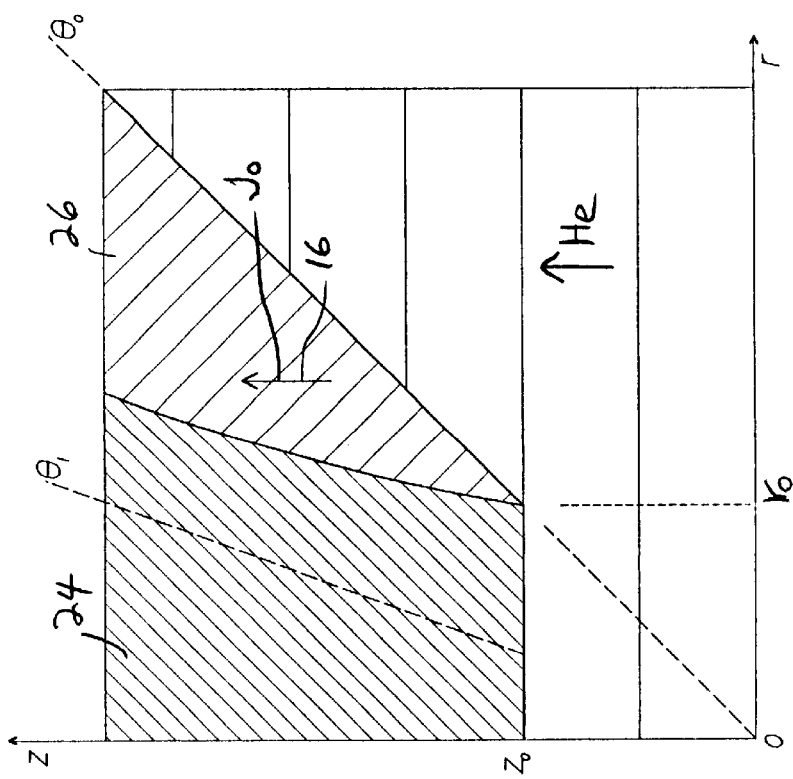
FIG. 3a is cross-sectional view of part of one form of magnetic structure in accordance with the invention. In this figure and in several of the other figures, only one quarter of the actual structure is shown, as the remaining three quarters are essentially mirror images. In particular, a mirror image of that quarter is present on the opposite side of the vertical axis which if present would illustrate the top half of the full structure, and, similarly, a mirror image of that top half is present on the opposite side of the horizontal axis which if present would illustrate both the top and bottom halves and thus the full structure in accordance with the invention. One embodiment of the full structure according to the invention is illustrated in FIGS. 8 and 9. It will be apparent from the figures which ones represent only part of the full structure.
Figure 4:
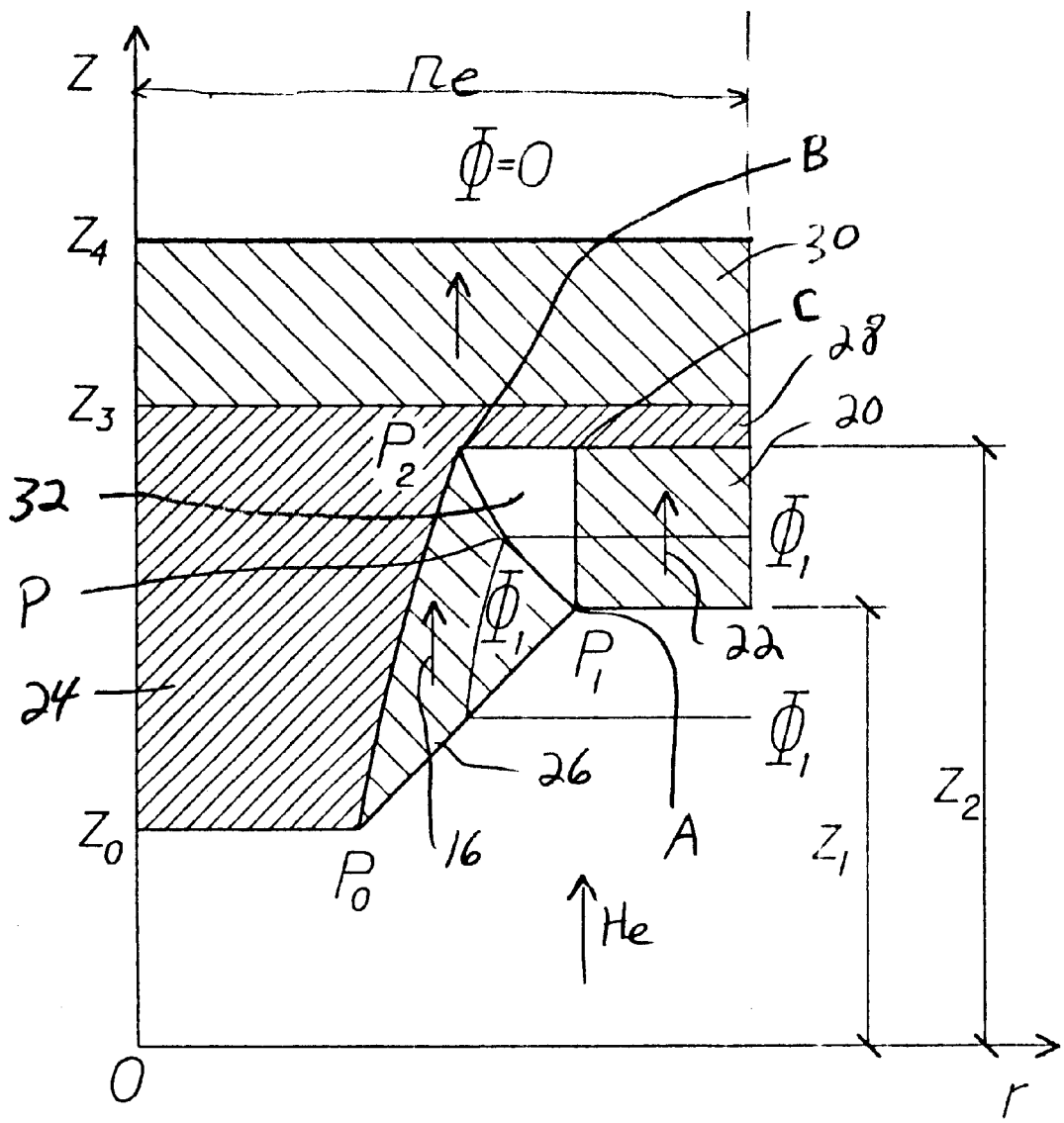
FIG. 4 is a cross-sectional view of part of another form of magnetic structure in accordance with the invention.

The next step in the development is to maintain the conical magnet shape but eliminate the magnetic material below $Z_0$ as shown in FIG. 3, and, as explained in the Appendix, provide an external termination of the conical body of magnetized material, which is accomplished by the transition from the conical magnetic structure 26 to an annular cylindrical structure 20 as illustrated in FIG. 4 (previously referred to as the additional first permanent magnetic member). The latter has a common axis along the z-axis and is oriented with its remanence 22 also parallel to the z-axis. Other changes are necessary as indicated and explained in the Appendix. The inner now-truncated ferromagnetic conical section 24 bounds as before the magnetized conical section 26 with the remanence 16 also parallel to the z-axis. A horizontal extension 28 of the ferromagnetic section 24 separates the conical section 26 and the cylindrical section 20 from an additional outer cylindrical magnetized body 30 (previously referred to as the additional second permanent magnetic member) which extends over and around the whole structure including the not-shown left quadrant and the not-shown two quadrants below. A nonmagnetic or empty space 32 separates the conical 26 and the cylindrical 20 sections. The uniform magnetic field in the non-magnetic space 32 is oriented vertically downward, opposite to the orientation of the field in the adjacent magnetic components 20, 26. The various symbols are explained in the Appendix.

Figure 5:
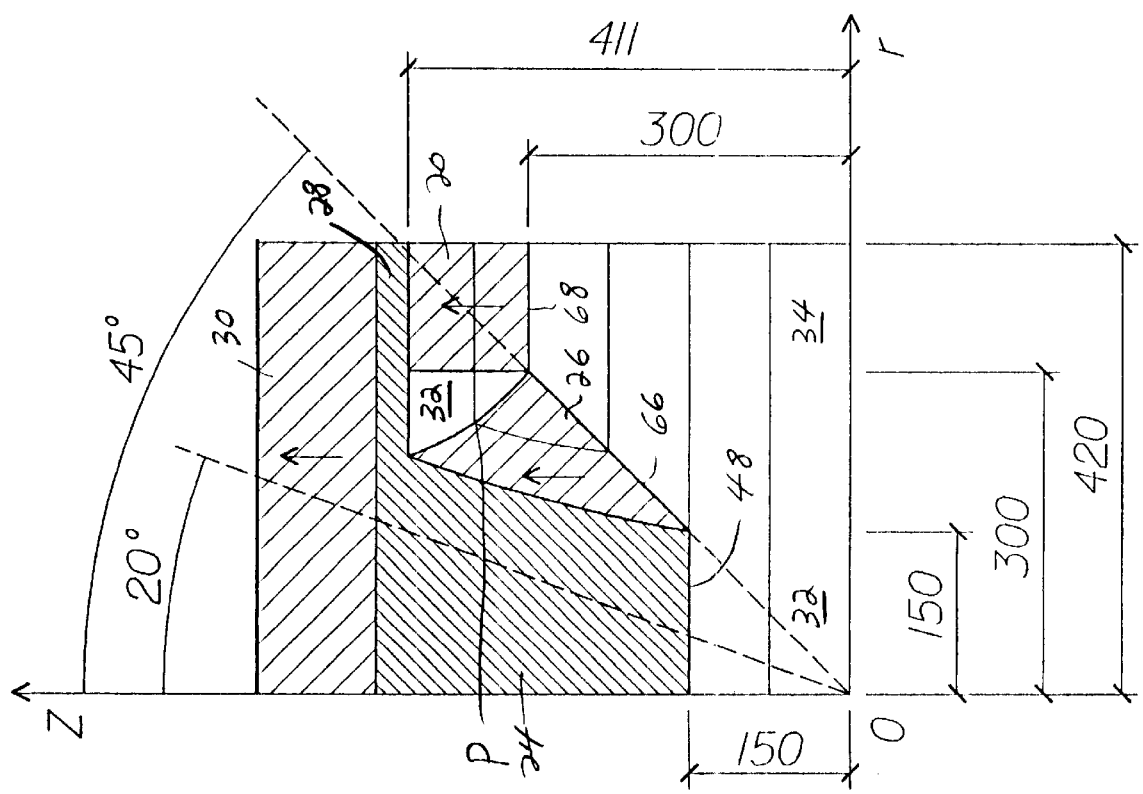
FIG. 5 is a cross-sectional view similar to that of FIG. 4 with some typical dimensions of the components indicated.

FIG. 5 illustrates the same structure with some typical dimensions in cm of the upper right quadrant to which the invention should not be limited. The angles 45° and 20° correspond to the half-angle $\theta_0$ and half-angle $\theta_1$. The space underneath the structure and thus between it and the corresponding not-shown structure beneath forms the cavity for receiving the patient. As will be noted, the cavity includes a smaller region 32 for accommodating the head of the patient, and a larger contiguous adjacent region 34 for accommodating the larger shoulders of the patient.

Figure 6:
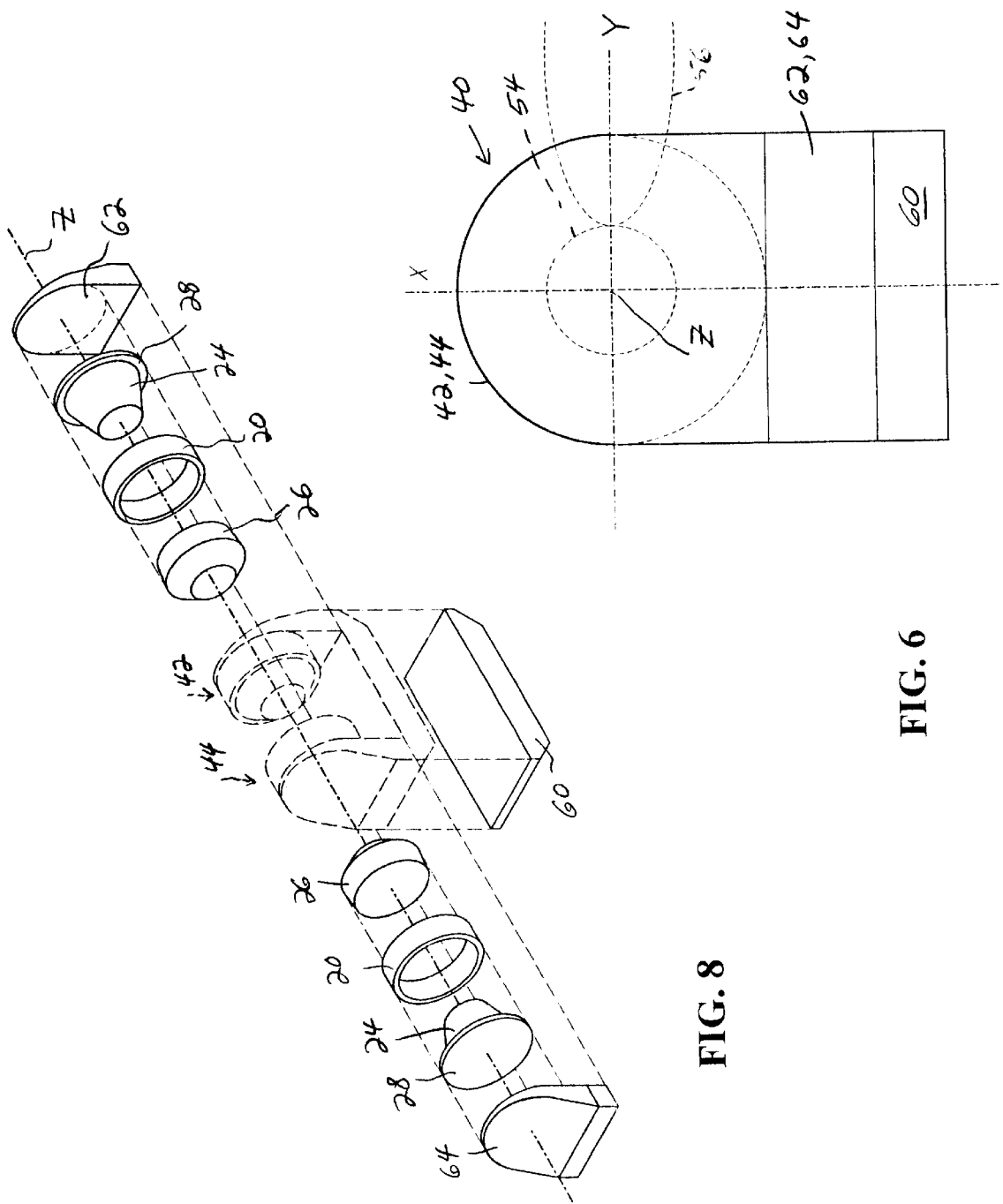
FIG. 6 is a top view of the full magnetic structure of which only one-quarter was previously illustrated and to which a yoke has been added. In this figure, a patient is schematically shown.
Figure 7:
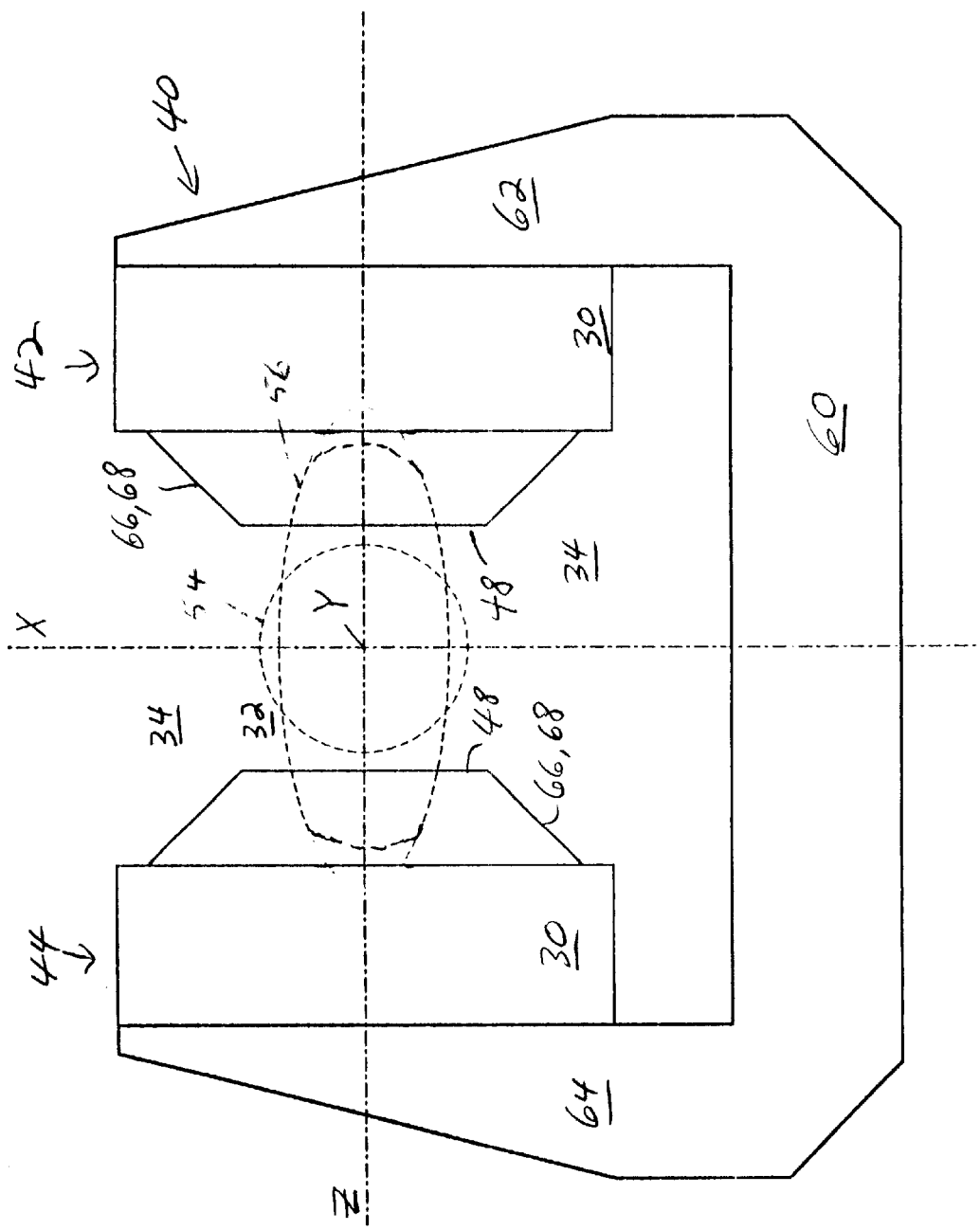
FIG. 7 is a side view of the magnetic structure shown in FIG. 6.

FIGS. 6 and 7 show, respectively, top and side views of a complete form of a preferred embodiment according to the invention indicated by 40. Looking first at FIG. 7, imagine that the structure illustrated in FIG. 5, rotated about the vertical and horizontal axes originating at the origin 0, are thus expanded to include both upper right (shown in FIG. 5) and left quadrants, to form a circular-symmetrical magnetic structure 42, spaced opposite to an identical structure 44 corresponding to the lower right and left quadrants. The cavity space between referenced 32 which is bounded by the bottom surfaces 48 of the inner ferromagnetic cores 24 (see FIG. 5) is the head cavity bordered on all sides by the larger shoulder cavity 34 bordered by the inner surfaces 66, 68 of the permanent magnetic components 26, 20. The head 54 and shoulders 56 of a patient lying on his or her back is illustrated by the dashed outline and extends parallel to the y-axis. The shoulders are behind the plane of the drawing. To the opposed symmetrical structures made up of the rotated quadrant illustrated in FIG. 5 has been added a conventional soft ferromagnetic U-shaped yoke with its bight 60 at the bottom and the two arms 62, 64 embracing the corresponding backs of the added cylindrical magnets 30. The z-axis in FIG. 6 is at the center perpendicular to the plane of the drawing, forming with the vertical x-axis and horizontal y-axis a rectangular coordinate system. The top view of FIG. 6 shows the circular symmetry about the z-axis of the main magnetic components 42, 44.

Figure 9:
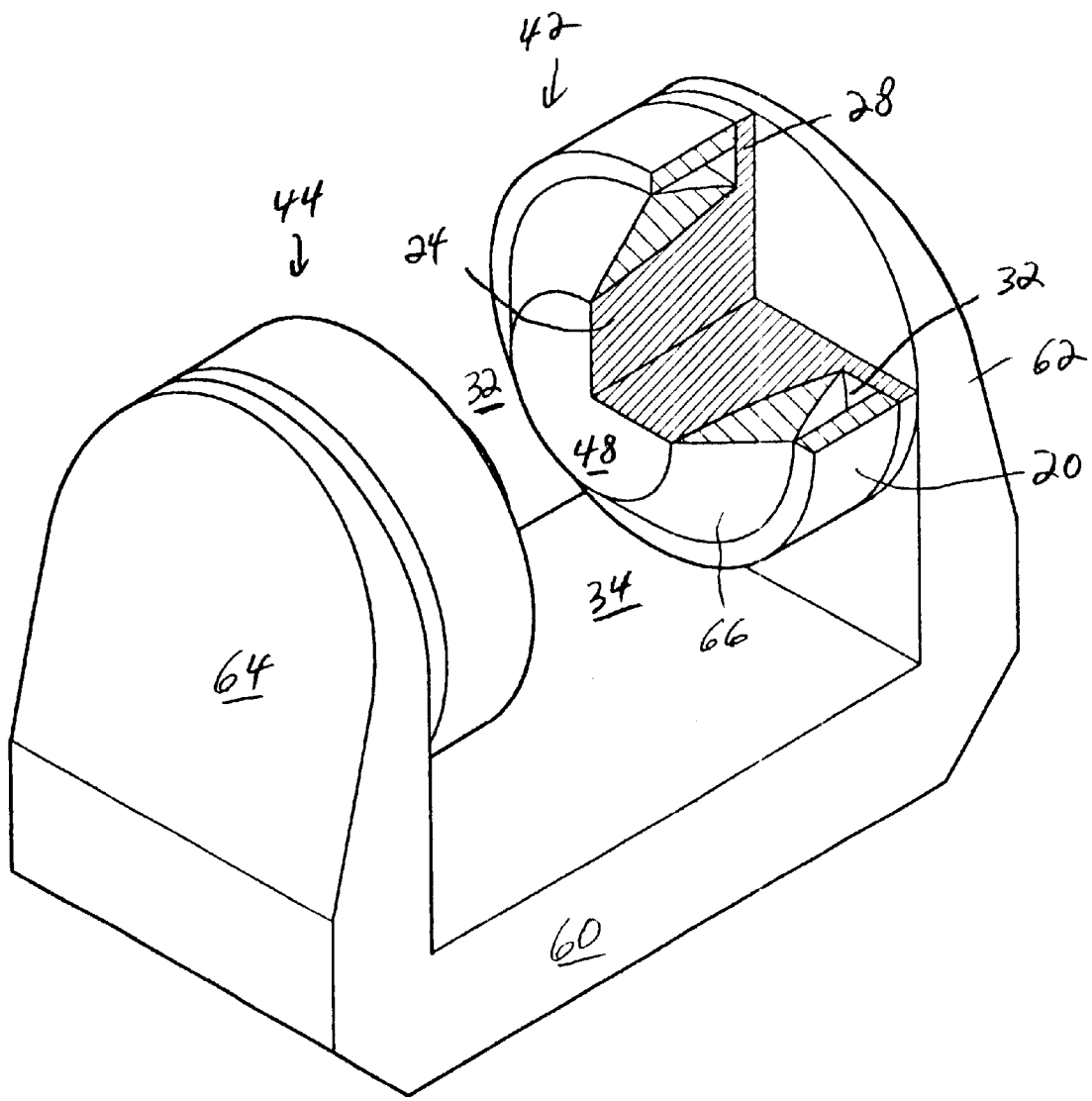
FIG. 9 is a perspective view of the FIG. 8 embodiment with one-quarter cut away to show the interior in part.

FIG. 9 is a perspective view of the structure of FIG. 7, and FIG. 8 is an exploded view. For simplicity, the additional cylindrical magnets 30 at the top and bottom have been omitted, but they have the same lateral extent as the adjacent lateral extension 28 of the high permeability core 24. The FIG. 8 view is depicted as if the whole structure 40 was lifted out of the yoke bight 60 and then exploded. The FIG. 9 embodiment shows one quadrant corresponding to FIG. 5 cut out and removed to show the inner construction. As will be observed, with the structure 40 lying on its base represented by the yoke bight 60, due to the symmetry, the patient can be introduced into the cavity from both sides as well as from the top, as the shoulder cavity 34 surrounds the smaller head cavity 32. The patient is positioned for head NMR imaging with its head inside the cavity 32 and its shoulders extending into the cavity 34. The object is to produce a magnet configuration that will generate a uniform imaging field in a region of interest surrounding the patient's head 54, the magnetic field having an intensity $H_0$ ($H_e$ in the Appendix) along the z axis in FIG. 7.

The intensity $H_0$ is related to the remanence J of the conical magnetic material by the equation:

$$K=(\mu_0 H_0)J$$

where $\mu_0$ is the magnetic permeability of a vacuum and K is a design parameter which is a function of the dimensions z of the structure as shown in the Appendix.

The dimensions in centimeters shown in FIG. 5, which are otherwise to scale, are only exemplary, and indicate representative values for one magnet design for a value of K=0.426, which would correspond to a uniform field in the imaging region of:

$$(\mu_0 He) \sim 0.55 \text{ Tesla, for } J \sim 1.3 \text{ Tesla.}$$

In the implementation illustrated in FIGS. 6–9, the magnetic structure is open from all sides except for the yoke base side to allow access to the surgical area. This opening usually introduces a distortion of the uniform field in the imaging region that must be partially corrected to bring the field variation within acceptable limits, typically within 10 ppm. This correction is part of the tuning or shimming of the magnet that compensates the distortion induced not only by the opening but also by the magnetization and fabrication tolerances.

Figure 10:
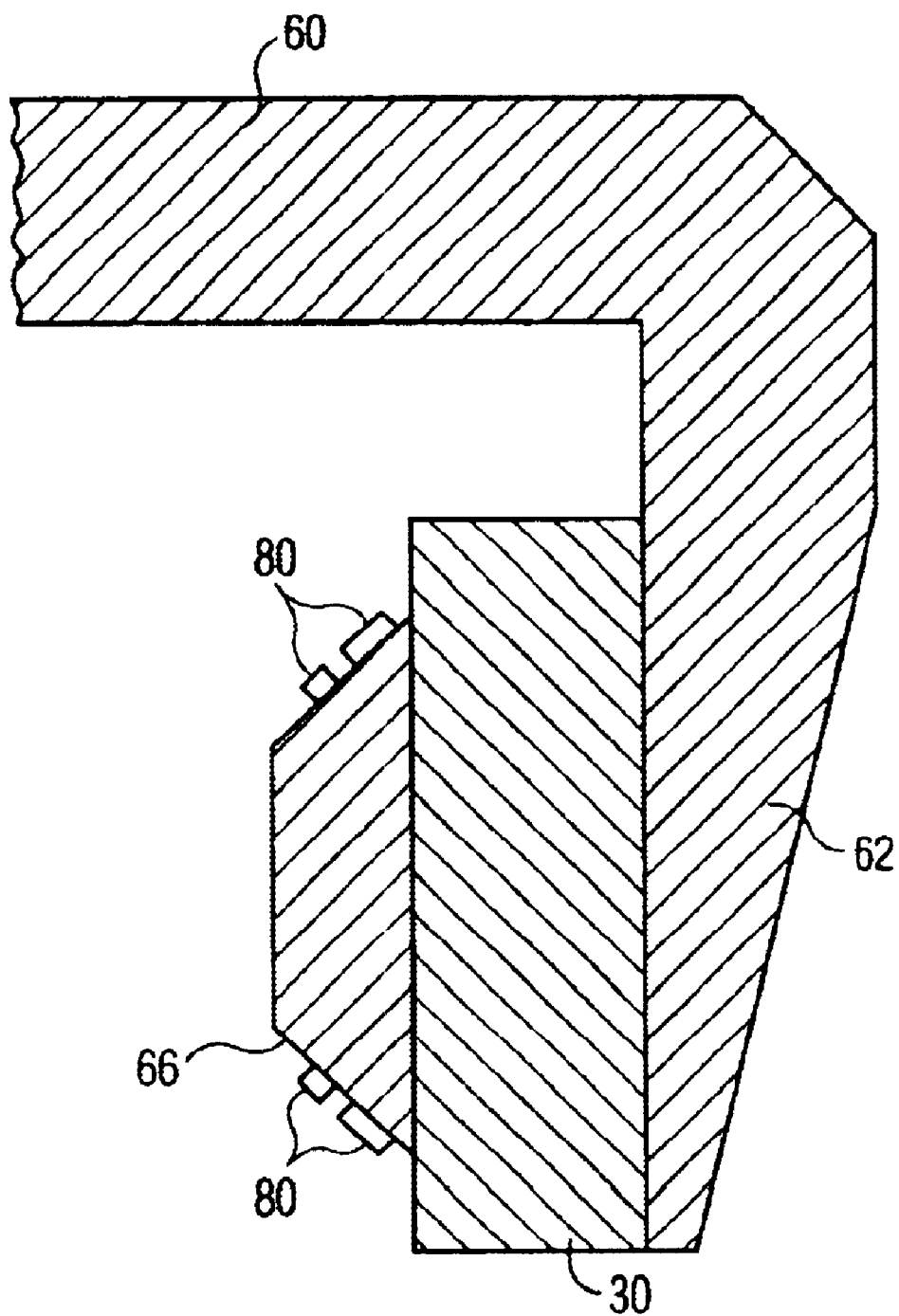
FIG. 10 is a schematic cross section of part of the magnetic structure of FIG. 7 illustrating the location of one form of a filter structure to compensate field distortions.

One way to accomplish the tuning of the magnet is by means of a filter structure assembled on the inner magnetic structure surfaces 48, 66, 68 as described in detail in one of my publications entitled "Linear Theory of Pole Piece Design in Permanent Magnets", published in the Proceedings of the Thirteenth International Workshop on Rare Earth Magnets and their Applications, Sep. 11–14, 1994, Birmingham, United Kingdom, whose contents are incorporated by reference in this application. This paper explains that the design of a suitable filter structure is the result of a linear theory of pole pieces developed by the author, in which the imaging region is assumed to be confined in a cylinder whose axis contains the imaging center and is perpendicular to the pole pieces. The cylinder is closed by the surfaces of the two pole pieces that act like reference surfaces of the magnetostatic potential. This potential generated by the magnet inside the cylinder is expanded in cylindrical harmonics as shown by equation 22 in the referenced paper in which the symbols have the meanings indicated in the paper and therefore do not need repeating here. In that equation, the first term on the right hand side is the uniform field, and the other terms are the harmonics of the field distortion corrected by the filter structure as described in that paper. These harmonics are eliminated if the sections of the filter are polarized with a dipole moment that satisfies equation 24 of the paper. As will be observed from the paper, the series of the field distortion converges rapidly and, as a consequence, only the lower order harmonics have to be compensated. The system of FIGS. 6–9 can be compensated by concentrating on the inner surfaces 48, 66, 68 of the structure bounding the cavities 32, 34 a suitable distribution of correcting dipole moments in magnets. Specific examples of filter design suitable for this application can be found in the paper and in my issued U.S. Pat. Nos. 5,475,355 and 5,495,222, whose contents are incorporated by reference in this application. One form of active filter structures are thin sandwiches of outer soft ferromagnetic plates bounding the cavity, magnetically isolated from the supporting magnetic structure, with a permanent magnetic insert or inserts between the plates. They can be located in accordance with the principles enunciated in the paper along the cavity-bounding interior surfaces to reduce or minimize field distortion. The filter structures typically tend to be positioned in the vicinity of the region of interest. FIG. 10 illustrates schematically one possible filter structure 80 on the conical surfaces of the structure, shown as several discrete or annular members made up of ferromagnetic and magnetized material which have the necessary magnetic properties and are distributed such as to compensate for field distortions as described in the referenced paper and patents.

The region of interest would typically be a spherical region or a region approximating a spherical region within the cavity, centered (for example, at z=0, y=0) where the geometry is symmetrical at a position where the degree of uniformity is acceptable, as explained typically a uniformity that does not vary by more than the 10 ppm over the whole of the region of interest.

Those skilled in the art will appreciate that the invention is not necessarily limited to structures with the dimensions indicated in the drawings, which are only to illustrate the size of a particular embodiment. The preferred geometry illustrated can be replaced by other geometries following the principles described herein. In particular, the half-angle $\theta_0$ and half-angle $\theta_1$ are not limited to the two values given in the preferred embodiment. Those values are preferred because they represent a good practical compromise among factors such as the overall size of the unit, the volume of magnetic material required, the magnetic field intensity, and the patient's accommodation. For example, increasing $\theta_0$ (for example, $\theta_1=20°$, $\theta_0=50°$, for K=0.55) increases the structure's size, requires more magnetic material, and may undesirably reduce the patient's cavity, though it will also allow a higher field intensity ($\mu_0 He$)~0.71 Tesla with the increased magnetic material. Keeping $\theta_0$ at 50°, but increasing $\theta_1$ to 30°, for example, likewise may also require more magnetic material but with a K=0.36 will result in a smaller field intensity ($\mu_0 He$)~0.47 Tesla. Reducing both angles will likely produce too narrow a practical structure with inadequate patient space. These other geometries are also considered within the scope of the invention. It will also be understood that the patient may be rotated about the y axis within the magnetic structure in order to allow the surgeon to access different sides of the brain.

A number of important advantages flow from the configurations of the invention, which include: an overall smaller structure size requiring less magnetic material while maintaining a high field intensity, accomplished with a structure that is considerably simpler than alternative structures.

To reduce dimensions and weight (very important when the structure is to be used in a surgical suite), the space between the body and the magnetic structure should be reduced to a minimum compatible with the design requirements of the structure bearing in mind the stringent requirements of field uniformity in the imaging region. Due to the close proximity of brain and shoulders the field uniformity must extend to the neck and shoulder region, though the field uniformity need not be quite as stringent in the neck and shoulder region.

Those skilled in the art will also appreciate that the invention is not limited to the specific shape of the yoke, and other geometries are also considered within the scope of the invention so long as saturation is avoided.

While the invention has been described in connection with preferred embodiments, it will be understood that modifications thereof within the principles outlined above will be evident to those skilled in the art and thus the invention is not limited to the preferred embodiments but is intended to encompass such modifications.

1. Introduction

The generation of highly uniform magnetic fields is the primary goal of the design of magnets for NMR imaging in medical applications. The magnet described in this application is a novel structure of permanently magnetized material that extends the field range to 0.5 Tesla, well above the current limit of commercially available permanent magnets, with a design approach that is consistent with size and weight well within practical limits.

The magnet combines a conical structure of permanently magnetized material with ferromagnetic pole pieces. The geometry of the magnet is computed in Section 2, and presents the principle of operation and the basic characteristics. The effect of the field perturbation due to the open magnet configuration is discussed in Section 3.

2. Conical Magnet

FIG. 1 shows the basic conical structure of magnetized material contained between two coaxial cones of half angles $\theta_1$, $\theta_0$. The material is assumed to be magnetized with a uniform remanence $J_o$ parallel to the axis z of the cones. The medium surrounding the external cone is assumed to be non-magnetic, and the medium inside the internal cone is assumed to be a ferromagnetic material with infinite magnetic permeability.

Assume a system of spherical coordinates p, $\theta$, $\psi$ where p is the distance of a point from the center O of the cones, $\theta$ is the angle between p and the axis z of the cones, and $\psi$ is the angle between the plane formed by a point and the z axis and an arbitrary plane that contains the z axis.

The structure of FIG. 1 has been analyzed in detail by the author previously. Assume the limit of infinite radial dimension of the cones and consider the special case of a field configuration independent of the angular coordinate $\psi$.

Let $$x = \cos \theta \qquad (2.1)$$

The magnetostatic potential $\Phi$ (p__, $\theta_{13}$) generated by remanence $J_o$ within the magnetized material is given by the particular solution of the Laplace's equation that satisfies the boundary condition $$\Phi(p_7\theta_1) = O \qquad (2.2)$$

One has $$\Phi(\rho, \theta) = -\frac{J_o}{\mu_o}(1-x_o^2)x_o\rho\left[1-\frac{x}{x_1}+\frac{x}{2}\ln\frac{(1+x_j)(1-x)}{(1-x_1)(1+x)}\right] \qquad (2.3)$$

for $\theta_1 < \theta < \theta_0$ and $\pi-\theta_0 < \theta < \pi-\theta_1$. $\mu$ is$_0$ the magnetic permeability of a vacuum and $$x_0 = \cos \theta_0, \; x_1 = \cos \theta_1 \qquad (2.4)$$

In the region $\theta_0 < \theta < \pi-\theta_0$ the magnetostatic potential is $$\Phi(\rho, \theta) = -\frac{J_o}{\mu_o}(1-x_o^2)\rho x\left[1-\frac{x_o}{x_j}+\frac{x_o}{2}\ln\frac{(1+x_1)(1-x_o)}{(1-x_1)(1+x_o)}\right] \qquad (2.5)$$

Eq. (2.5) is the potential of a uniform magnetic field of intensity $H_e$ oriented parallel to the z axis and magnitude $$\mu_o H_e = K J_o \qquad (2.6)$$

where $$K = (1-x_o^2)\left[1-\frac{x_o}{x_j}+\frac{x_o}{2}\ln\frac{(1+x_1)(1-x_o)}{(1-x_1)(1+x_o)}\right] \qquad (2.7)$$

The equipotential surfaces are planes perpendicular to z in the region $\theta_0 < \theta < \pi-\theta_0$ and within the magnetized material the equipotential surfaces are given by the equation $$\rho = \frac{C}{\frac{x}{2}\ln\frac{(1+x_1)(1-x)}{(1-x_1)(1+x)}+1-\frac{x}{x_1}} \qquad (2.8)$$

where $$C = -\frac{\mu_o \Phi}{J_o x_o(1-x_o^2)} \qquad (2.9)$$

Figure 2:
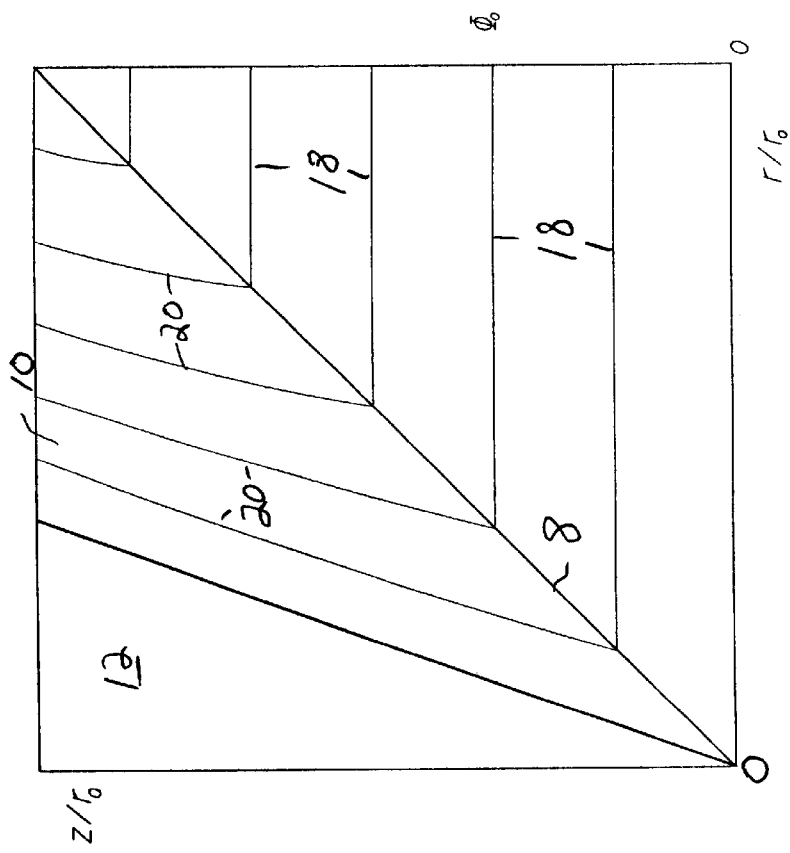
FIG. 2 illustrates some exemplary equipotential surfaces present in the structure of FIG. 1.

An example of the equipotential lines given by Eq. (2.8) is shown in FIG. 2 for the cone angles $\theta=20°$, $\theta=45°$. In this example, the uniform field in the region $\theta<\theta<\pi-\theta$ corresponds to a value of K as given by Eq. (2.7).

$$K = 0.426 \qquad (2.10)$$

Hence if one assumes a value $$J \sim 1.3 \text{ Tesla} \qquad (2.11)$$

The cone generates a uniform field of intensity $H_e$ $$\mu_o H_e \sim 0.55 \text{ Tesla} \qquad (2.12)$$

The basic schematic of FIG. 1 can provide the computation of the field in a structure where the magnetized material is eliminated in the region $$-z_o < z < +z_o \qquad (2.13)$$

The new structure is shown in FIG. 3 where the two areas of the surfaces that limit region (2.13) are circles of radius $$r_o = z_o \tan \theta_o \qquad (2.14)$$

The two circular areas are assumed to be surfaces of an infinite magnetic permeability material. Furthermore, the equipotential surface within the magnetized material that starts from the circle of radius $r_o$ is also assumed to be transformed into a surface of infinite magnetic permeability material. As a consequence, the field configuration inside the magnetized material is still given by Eq. 2.3 and the structure of FIG. 3 generates the uniform field defined by Eqs. (2.6) and (2.7) everywhere outside the magnetized material, including the gap between the ferromagnetic inserts 24 of radius $r_o$. An additional source, other than the magnetized material in FIG. 3, is necessary to maintain the block of ferromagnetic material in the structure of FIG. 3 at the potential $$\Phi_o = -H_e z_o \qquad (2.15)$$

The design of the complete structure depends upon this external termination of the conical body of magnetized material. This can be accomplished by the transition from the conical structure 26 to a cylindrical structure 20 shown in the schematic of FIG. 2.4. The cylindrical structure is contained between the planes $z=z_1$, $z=z_2$ and its thickness $z_2-z_1$ is given by $$\frac{z_2 - z_1}{z_3} = K \quad (2.16)$$

The cylindrical structure is magnetized with the uniform remanence J parallel to the axis z. The structure cannot interface directly with the cone, and a region (ABC) of non-magnetic material has to be inserted between the two. The uniform field inside (ABC) has an intensity oriented in the opposite direction to the z axis, and the magnetostatic potential is a linear function of z changing from $\Phi=0$ at point A to the value $\Phi_1$ at point B. The interface (AB) between the cone and the non-magnetic region is given by the points P, which are the intersection of equipotential lines $\Phi$ in the cone, and the same equipotential lines in the non-magnetic region as indicated in FIG. 2.4. By virtue of Eqs. (2.8) and (2.9), the equations of the equipotential lines inside the cone can be written in the form $$\frac{\rho}{\bar{p}} = \frac{\frac{x_o}{2}\ln\frac{(1+x_1)(1-x_o)}{(1-x_1)(1+x_o)} + 1 - \frac{x_o}{x_1}}{\frac{x}{2}\ln\frac{(1+x_1)(1-x)}{(1-x_1)(1+x)} + 1 - \frac{x}{x_1}} \quad (2.17)$$

where p is the distance of the point of potential $\Phi$ on the cone of angular width $\theta_o$ from O. In coordinates p, $\theta$, the equations of the equipotential lines in the non-magnetic region (ABC) are $$\rho = \frac{z}{x}, \quad \frac{z_2 - z}{z_2 - z_1} = \frac{\Phi}{\Phi_1} \quad (2.18)$$

Thus, the system of Eqs. (b 2.17) and (2.18) provides the equation of line (AB)

$$\frac{1}{x} = \frac{\bar{p}}{z} \cdot \frac{\frac{x_o}{2}\ln\frac{(1+x_1)(1-x_o)}{(1-x_1)(1+x_o)} + 1 - \frac{x_o}{x_1}}{\frac{x}{2}\ln\frac{(1+x_1)(1-x)}{(1-x_1)(1+x)} + 1 - \frac{x}{x_1}} \quad (2.19)$$

The combination of both transitions of FIGS 3 and 2.4 provides the basic structure of the magnet shown in FIG. 5.

The potential $\Phi$ of the $\mu=\infty$ component of the magnetic structure of FIG. .5 is generated with the additional planar structure contained between the planes $z=z_3$, $z=z_4$ where $z_3$ is arbitrarily chosen and the thickness is $z_4-z_3$ is $$\frac{z_4 - z_3}{z_o + z_4 - z_3} = K \quad (2.20)$$

Again, this external planar structure is uniformly magnetized with the remanence $J_o$ parallel to the z axis. The surface $z=z_4$ is the interface between the magnetic structure and the external yoke of the magnet that closes the flux of the magnetic induction. Finally, the cylindrical structures can be truncated at a radial distance $r_e$ that minimizes the perterbation of the field uniformity in the gap between the pole pieces. The total view of the magnet is shown in FIGS. 2.6 and 2.7.

What is claimed is:

1. A magnetic structure for generating a uniform magnetic field capable of implementing NMR imaging of the head of a patient within a region of interest, comprising:
   a) first and second magnetic structures defining a first cavity having the region of interest and configured to accommodate the head of a patient and defining adjacent the first cavity a second cavity, larger than the first cavity, configured to accommodate the shoulders of the patient when the latter's head is positioned in the first cavity, the first and second magnetic structures being positioned on opposite sides of the first and second cavities and defining a common longitudinal axis through the centers of the first and second magnetic structures and providing access from the outside for surgical intervention to the head of the patient when positioned within the first cavity,
   characterized in that:
   b) each of the first and second magnetic structures comprises a conically-shaped magnet having a conical axis and having an apex, a first side opposite the apex, and second and third conical sides connecting the first side and the apex, each of said conically-shaped magnets being configured to produce within the region of interest in the first cavity a uniform magnetic field capable of implementing NMR imaging,
   c) each of the first and second magnetic structures further comprising adjacent their respective conically-shaped magnet a first cylindrical magnetic structure having a longitudinal axis coincident with the common longitudinal axis,
   d) the conically-shaped magnets and the first cylindrical magnetic structures being configured to extend the uniform field within the region of interest to the second cavity such that the uniformity of the magnetic field in the region of interest remains capable of implementing NMR imaging.

2. A magnetic structure for generating a uniform magnetic field capable of implementing NMR imaging of the head of a patient within a region of interest as claimed in claim 1, wherein the first and second magnetic structures are configured such that the second cavity surrounds the first cavity.

3. A magnetic structure for generating a uniform magnetic field capable of implementing NMR imaging of the head of a patient within a region of interest as claimed in claim 1, wherein the first cylindrical magnetic structure is annular.

4. A magnetic structure for generating a uniform magnetic field capable of implementing NMR imaging of the head of a patient within a region of interest as claimed in claim 1, wherein both the first and second magnetic structures are circular symmetric about the common longitudinal axis.

5. A magnetic structure for generating a uniform magnetic field capable of implementing NMR imaging of the head of a patient within a region of interest wherein each of the first and second magnetic structures comprising:
   i) a truncated conical section whose conical axis coincides with the common longitudinal axis and having a short side adjacent the first cavity and a long side remote from the first cavity, the truncated conical section including the conically-shaped magnet and a high permeability ferromagnetic member,
   ii) said first cylindrical magnet being adjacent the long side of the conical section and having an axis common with the common longitudinal axis and having a first side closer to the first cavity and a second side remote from the first cavity, iii) a second cylindrical magnet being adjacent the remote side of the first cylindrical magnet and having an axis common with the common longitudinal axis and having a first side closer to the cavity and a remote side remote from the cavity, iv) the truncated conical section comprising an outer coaxial cone having half angles $\theta_1$ and $\theta_0$ and an inner coaxial cone comprising the high-permeability ferromagnetic member, v) the half angles $\theta_1$ and $\theta_0$ being selected such that the desired uniform field in the first and second cavities is achieved.

6. A magnetic structure for generating a uniform magnetic field capable of implementing NMR imaging of the head of a patient within a region of interest as claimed in claim 5, wherein the half angles $\theta_1$ and $\theta_0$ have values of about 20° and 45° respectively.

7. A magnetic structure for generating a uniform magnetic field capable of implementing NMR imaging of the head of a patient within a region of interest as claimed in claim 1, wherein the uniform magnetic field is oriented in a direction parallel to the common longitudinal axis, and the remanences of both the conically-shaped magnet and the first cylindrical magnetic structure are also oriented in a direction parallel to the common longitudinal axis.

8. A magnetic structure for generating a uniform magnetic field capable of implementing NMR imaging of the head of a patient within a region of interest as claimed in claim 7, wherein each of the first and second magnetic structures further comprises a non-magnetic insert between the first side of the conically-shaped magnet and the adjacent side of the first cylindrical magnetic structure.

9. A magnetic structure for generating a uniform magnetic field capable of implementing NMR imaging of the head of a patient within a region of interest as claimed in claim 8, wherein the non-magnetic insert of each of the first and second magnetic structures has a magnetic field intensity oriented in a direction opposite to the orientation of the remanences of both the conically-shaped magnet and the first cylindrical magnetic structure.

10. A magnetic structure for generating a uniform magnetic field capable of implementing NMR imaging of the head of a patient within a region of interest, comprising:

a) first and second magnetic structures defining a first cavity having the region of interest and configured to accommodate the head of a patient and defining adjacent the first cavity a second cavity, larger than the first cavity, configured to accommodate the shoulders of the patient when the latter's head is positioned in the first cavity, the first and second magnetic structures being positioned on opposite sides of the first and second cavities and defining a common longitudinal axis through the centers of the first and second magnetic structures and providing access from the outside for surgical intervention to the head of the patient when positioned within the first cavity, characterized in that:

b) each of the first and second magnetic structures comprises a conically-shaped hollow magnet having a conical axis and having an apex, a first side opposite the apex, and second and third conical sides connecting the first side and the apex, each of said conically-shaped magnets being configured to produce within the region of interest in the first cavity a uniform magnetic field capable of implementing NMR imaging, c) each of the first and second magnetic structures further comprising adjacent their respective conically-shaped magnet a first cylindrical magnetic structure having a longitudinal axis coincident with the common longitudinal axis, d) the conically-shaped magnets and the first cylindrical magnetic structures being configured to extend the uniform field within the region of interest to the second cavity such that the uniformity of the magnetic field in the region of interest remains capable of implementing NMR imaging, e) each of the first and second magnetic structures further comprising a high permeability ferromagnetic member filling the hollow within the conically-shaped magnet.

11. A magnetic structure for generating a uniform magnetic field capable of implementing NMR imaging of the head of a patient within a region of interest as claimed in claim 10, wherein each of the high permeability ferromagnetic members have a flat first surface adjacent the first cavity.

12. A magnetic structure for generating a uniform magnetic field capable of implementing NMR imaging of the head of a patient within a region of interest as claimed in claim 11, wherein the first surface of each of the high permeability ferromagnetic members is in the same plane as the apex of the adjacent conically-shaped magnet.

13. A magnetic structure for generating a uniform magnetic field capable of implementing NMR imaging of the head of a patient within a region of interest as claimed in claim 10, wherein each of the high permeability ferromagnetic members further comprises a lateral extension positioned on the side of the first cylindrical magnetic structure remote from the second cavity.

14. A magnetic structure for generating a uniform magnetic field capable of implementing NMR imaging of the head of a patient within a region of interest as claimed in claim 10, wherein each of the first and second magnetic structures further comprises a non-magnetic insert between the first side of the conically-shaped magnet and the adjacent side of the first cylindrical magnetic structure.

15. A magnetic structure for generating a uniform magnetic field capable of implementing NMR imaging of the head of a patient within a region of interest as claimed in claim 14, wherein the non-magnetic insert of each of the first and second magnetic structures has a triangular cross-section with its apex adjacent the second cavity.

16. A magnetic structure for generating a uniform magnetic field capable of implementing NMR imaging of the head of a patient within a region of interest as claimed in claim 10, further comprising a yoke magnetically connected to the first and second magnetic structures.

17. A magnetic structure for generating a uniform magnetic field capable of implementing NMR imaging of the head of a patient within a region of interest as claimed in claim 10, wherein the high permeability ferromagnetic member of each of the first and second magnetic structures has a generally conical shape.

18. A magnetic structure for generating a uniform magnetic field capable of implementing NMR imaging of the head of a patient within a region of interest as claimed in claim 10, each of the first and second magnetic structures further comprises a second cylindrical magnetic structure positioned on the side of the high permeability ferromagnetic member remote from the first cavity.

19. A magnetic structure for generating a uniform magnetic field capable of implementing NMR imaging of the head of a patient within a region of interest as claimed in claim 18, wherein the second cylindrical magnetic structure of each of the first and second magnetic structures extends laterally across the whole magnetic structure.

20. A magnetic structure for generating a uniform magnetic field capable of implementing NMR imaging of the head of a patient within a region of interest as claimed in claim 18, further comprising a yoke magnetically connected to the first and second magnetic structures, the yoke being magnetically connected to the side remote from the first cavity of each of the first and second cylindrical magnetic structures.

21. A magnetic structure for generating a uniform magnetic field capable of implementing NMR imaging of the head of a patient within a region of interest as claimed in claim 18, wherein the uniform magnetic field is oriented in a direction parallel to the common longitudinal axis, and the remanences of the conically-shaped magnets and the first and second cylindrical magnetic structures are also oriented in a direction parallel to the common longitudinal axis.

22. A magnetic structure for generating a uniform magnetic field capable of implementing NMR imaging within a region of interest as claimed in claim 21, further comprising a filter structure bounding the second cavity, said filter structure being configured to compensate distortion of the imaging field.

* * * * *